United States Patent [19]

Lawrence

[11] Patent Number: 5,706,303
[45] Date of Patent: Jan. 6, 1998

[54] LASER DIODE COUPLING AND BIAS CIRCUIT AND METHOD

[76] Inventor: Zachary Andrew Lawrence, 10930 Squawbush Loop, Peyton, Colo. 80831

[21] Appl. No.: 630,027
[22] Filed: Apr. 9, 1996
[51] Int. Cl.$^6$ .................................... H01S 3/00
[52] U.S. Cl. ........................ 372/38; 372/26; 372/43
[58] Field of Search ........................ 372/26, 28, 31, 372/32, 34, 33, 38, 43, 50, 69, 70, 96, 109

[56] References Cited

U.S. PATENT DOCUMENTS

| | | | |
|---|---|---|---|
| 4,379,273 | 4/1983 | Bender | 333/32 |
| 4,485,361 | 11/1984 | Bender | 333/32 |
| 4,723,312 | 2/1988 | Yamashita et al. | 372/38 X |
| 4,802,178 | 1/1989 | Ury | 372/36 |
| 4,813,045 | 3/1989 | Culpepper | 372/38 |
| 4,834,491 | 5/1989 | Aoki et al. | 385/88 X |
| 4,937,660 | 6/1990 | Dietrich et al. | 372/36 X |
| 4,959,535 | 9/1990 | Garrett | 372/38 X |
| 5,065,226 | 11/1991 | Kluitmans et al. | 372/43 X |
| 5,128,950 | 7/1992 | Tsuchiya et al. | 372/25 |
| 5,216,303 | 6/1993 | Wandel | 333/32 |
| 5,347,529 | 9/1994 | Noe | 372/28 |
| 5,361,156 | 11/1994 | Pidgeon | 359/161 |
| 5,371,755 | 12/1994 | Murata et al. | 372/38 |
| 5,424,680 | 6/1995 | Nazararthy et al. | 330/149 |
| 5,444,727 | 8/1995 | Mathoorasing | 372/38 |
| 5,479,288 | 12/1995 | Ishizuka et al. | 359/163 |

Primary Examiner—Brian Healy
Attorney, Agent, or Firm—Dale B. Halling

[57] ABSTRACT

A laser diode coupling and bias circuit (50) includes a laser diode (84) in a hermetically sealed housing (80) having a pair of inputs (76, 78). The laser diode (84) is attached to a printed circuit board (52). The printed circuit board (52) has a number of connection points and a ground plane. One of the pair of inputs (76, 78) of the laser diode (84) is coupled to one of the connection points (86) that is electrically connected to the ground plane of the printed circuit board (52). A second (76) of the pair of inputs (76, 78) of the laser diode (84) is connected to a second (76) of the connection points. An input transmission line (54) is attached to the printed circuit board (52) at a modulation input connection (56) and at the second (76) of the connection points. The input transmission line (54) has a blocking capacitor (72). A two pole equalization filter (74) is coupled between the input transmission line (54) and the ground plane. A bias voltage input (82) is coupled to the two pole equalization filter (74).

19 Claims, 4 Drawing Sheets

LASER DIODE COUPLING AND BIAS CIRCUIT AND METHOD

FIELD OF THE INVENTION

The invention relates generally to the field of optical communications and more particularly to a laser diode coupling and bias circuit.

BACKGROUND OF THE INVENTION

Optical communication systems have the potential to transmit information at extremely high data rates (e.g., multi-gigabit). Fulfilling this potential has been difficult due to the low input impedance of laser diodes. Matching the input impedance of the laser diode with the 50 Ω impedance of a typical transmission line has been difficult. All the solutions have required designing special hermetically sealed housings having hybrid circuits on which the laser diode is mounted. While this has been successful in obtaining high data rates, these special housings and hybrid circuits are very expensive. They have to be assembled in clean rooms with highly skilled technicians. All this is very expensive. As a result only large telecommunications companies that buy these packages in large quantities can afford to buy these specialized laser diode packages. A number of users, such as researchers and start up companies, cannot afford the price or commit to the quantities necessary to obtain these specialized laser diode packages. Most of these users are forced to buy laser diodes in hermetically sealed cans, known as TO cans. The TO cans add their own parasitic capacitance and inductance. Without the advantages provided by integrating the coupling circuitry and the laser diode in the same package, the TO can laser diode lasers are commonly limited to data rates of a hundred megabits.

Thus there exists a need for a laser diode coupling and bias circuit and method that allows a laser diode in a TO package to transmit data rates in the gigabit range. In addition to these attributes the circuit and method should be inexpensive and easy to manufacture in small or large quantities.

SUMMARY OF THE INVENTION

A laser diode coupling and bias circuit that overcomes these and other problems includes a laser diode in a hermetically sealed housing having a pair of inputs. The laser diode is attached to a printed circuit board. The printed circuit board has a number of connection points and a ground plane. One of the pair of inputs of the laser diode is coupled to one of the connection points that is electrically connected to the ground plane of the printed circuit board. A second of the pair of inputs of the laser diode is connected to a second of the connection points. An input transmission line is attached to the printed circuit board at a modulation input connection and at the second of the connection points. The input transmission line has a blocking capacitor. A two pole equalization filter is coupled between the input transmission line and the ground plane. A bias voltage input is coupled to the two pole equalization filter.

DETAILED DESCRIPTION OF THE DRAWINGS

Figure 1:
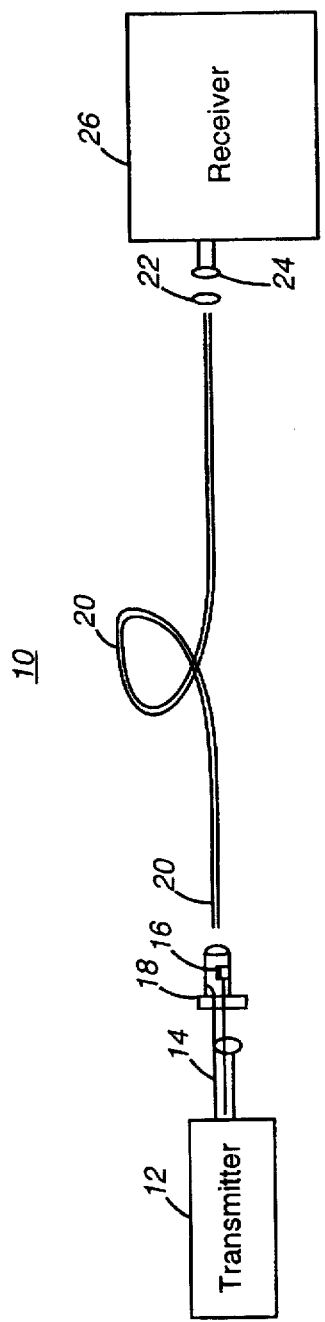
FIG. 1 is a schematic diagram of a laser communication system.

The present invention takes advantage of low cost widely available TO can laser diodes to build low cost high data rate (>1 Gbps) optical transmitters, that form part of an optical communication system. FIG. 1 shows a schematic diagram of an optical communication system 10. The optical communication system 10 has a transmitter 12 that produces a modulation signal 14. The modulation signal 14 drives a laser diode 16 shown in a hermetically sealed housing (TO can) 18. The modulated laser light is coupled into a fiber optic cable 20. The fiber optic cable 20 carries the modulated light signal. At the end of the fiber optic cable 20 an optical system 22 focuses the modulated light signal on a photo-diode 24 that converts the light signal to an electrical signal. The electrical signal is then demodulated at a receiver 26.

Figure 2:
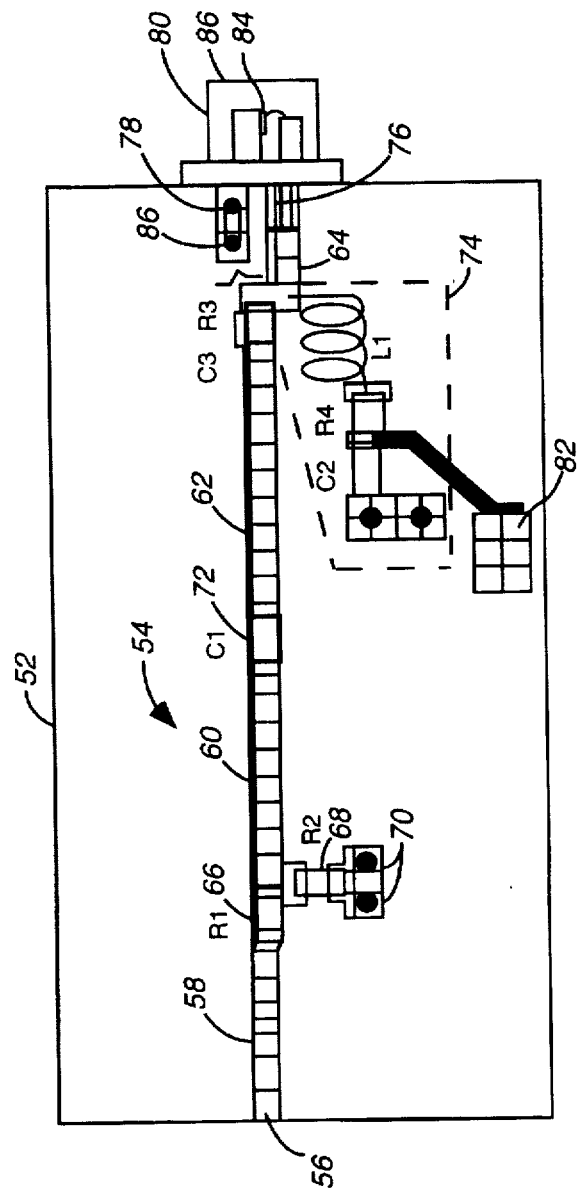
FIG. 2 is a schematic diagram of a laser diode coupling and bias circuit.

FIG. 2 shows a schematic diagram of the laser diode coupling and bias circuit 50. The circuit 50 has a printed circuit board 52 having a plurality of connection points. The printed circuit board 52 in this embodiment is designed to accept surface mount components. The input modulation signal is coupled to the input transmission line 54 at a modulation input connection 56. Typically the modulation signal is carried by a coaxial cable having a 50 Ω characteristic impedance. One of standard coaxial connectors is used to couple the coaxial cable to the input transmission line 54. The input transmission line 54 is composed of a plurality of micro-strip line transmission lines (surface mount micro-strip line transmission lines) 58–64 that are mounted to the printed circuit board. The plurality of micro-strip line transmission lines 58–64 are designed to have a characteristic impedance (input impedance) of 50 Ω. Between a pair of the micro-strip line transmission lines 58, 60 is an L pad resistive attenuator (resistive attenuator) 66, 68 consisting of a series resistor (R1) 66 and a parallel resistor (R2) 68 connected to a ground plane of the printed circuit board 52 by a pair of vias 70. A blocking capacitor (C1) 72 is coupled between a pair of micro-strip line transmission lines 60, 62. A two pole equalization filter (high pass equalization filter) 74 is coupled between the input transmission line 54 and a second 76 of a pair of inputs 76, 78 of a hermetically sealed package 80. The two pole equalization filter 74 is coupled to a bias voltage input 82. The hermetically sealed housing (TO can) 80 contains a laser diode 84 and a window 86. A first 78 of the pair of inputs 76, 78 is connected to a first 86 of the plurality of connection points. The first 86 connection point is connected to a ground plane of the printed circuit board 52. The second 76 of the pair of inputs 76, 78 is connected to a second 76 of the plurality of connection points on the printed circuit board 52. The circuit 50 is easy to assembly and does not have to be assembled in a clean room. As a result the circuit can be manufactured inexpensively in both small and large quantities.

Figure 3:
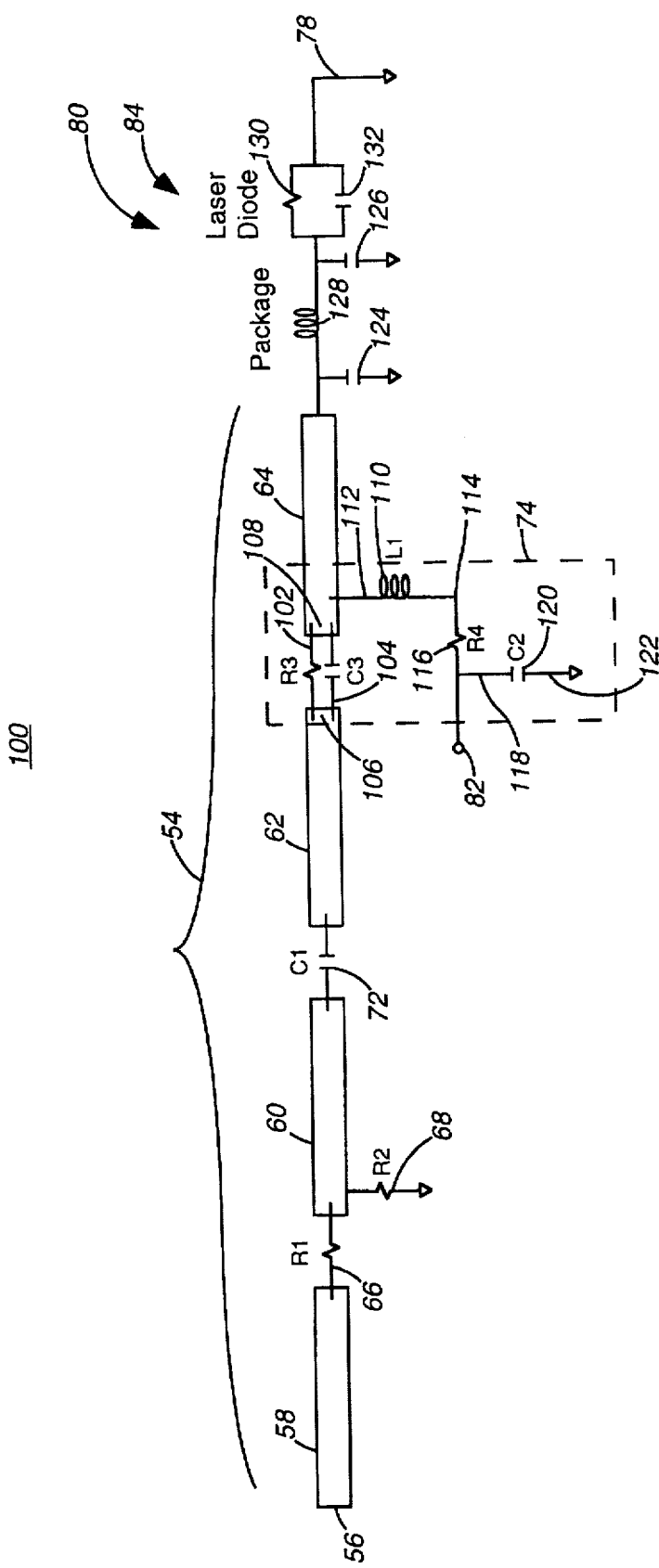
FIG. 3 is a circuit diagram of the laser diode coupling and bias circuit of FIG. 2.

An equivalent circuit 100 of the laser diode coupling and bias circuit 50 is shown in FIG. 3. Between a pair of the micro-strip line transmission lines 58, 60 is an L pad resistive attenuator 66, 68. The resistive attenuator 66, 68 is not used in all embodiments of the invention. The two pole equalization filter 74 is designed to have a low circuit Q. The resistive attenuator is used to bleed off some of the reflective wave that results due to imperfect impedance matching of the transmission line and the laser diode package across the whole frequency spectrum. This eliminates extraneous modulation created by random phasing of standing waves. The circuit consists of a resistor 102 and a capacitor 104 connected in parallel with each other. The resistor 102 and the capacitor 104 have an input 106 coupled to the input transmission line 54 and an output 108 connected to the second connection point 76. In addition the two pole equalization circuit 74 has an inductor 110 with a first end 112 connected to the output 108 of the resistor 102 and the capacitor 104. A second end 114 of the inductor 110 is connected to a first end 114 of a second resistor 116. A second end 118 of the second resistor 116 is connected to a first end 118 of a second capacitor 120. A second end 122 of the second capacitor 120 connected to ground 122.

FIG. 3 also shows the equivalent circuit for the TO can 80 and the laser diode 84. The package looks like a pair of parallel capacitors 124, 126 with a series inductor 128. The laser diode 84 has a resistive element 130 and an a capacitive element 132.

Figure 4:
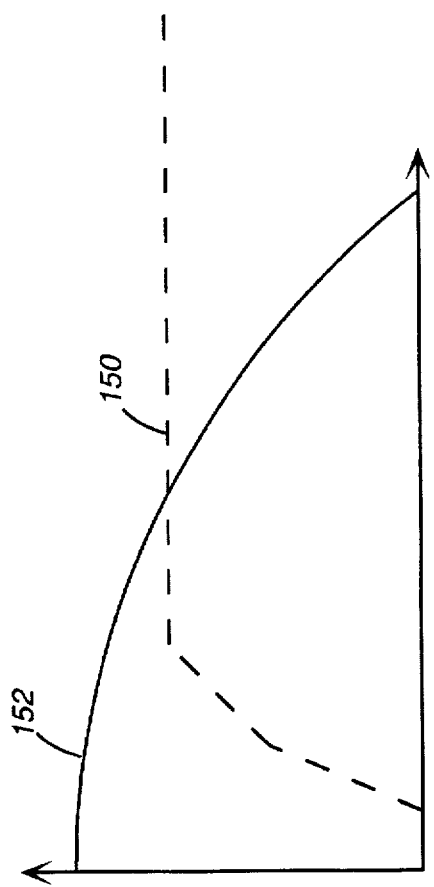
FIG. 4 is an amplitude-frequency plot of a TO can laser diode and a two pole equalization circuit.

The high pass equalization filter 74 is a two pole high pass filter. FIG. 4 shows an amplitude-frequency plot of the high pass equalization filter 74 in a dashed line 150. The frequency response of the laser diode in a TO can is shown as a solid line 152 in FIG. 4. The plot is not to scale and actual frequency plots will vary based on the individual characteristics of the TO cans and laser diodes. The plots show that the high pass equalization circuit 74 attenuates the low frequencies and this tends to level out the response of the circuit 50 across the frequency spectrum of interest.

Figure 5:
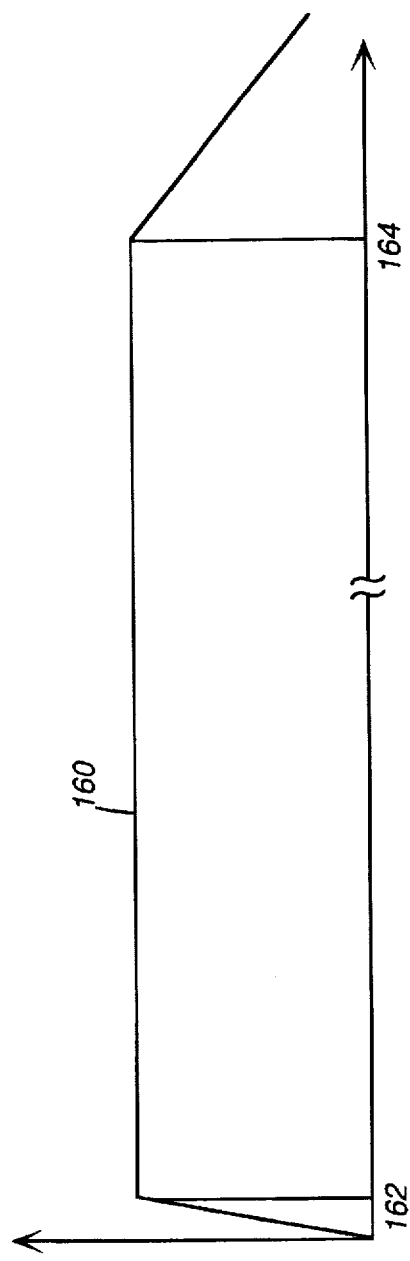
FIG. 5 is an amplitude-frequency plot of the laser diode coupling and bias circuit of FIG. 2.

The laser diode coupling and bias circuit 100 receives a broadband modulation input signal at connection point 56. The broadband signal is transmitted through an impedance match transmission line that includes a resistive attenuator 66, 68. The resistive attenuator 66, 68 is used to bleed off some of the reflective wave that results due to imperfect impedance matching of the transmission line and the laser diode package across the whole frequency spectrum. The blocking capacitor 72 is used to eliminate any offset voltage (DC component) of the broadband modulation input signal received at the modulation signal input connection 56. The AC modulation signal then has its low frequency range attenuated by the high pass filter 74. The attenuated signal is combined with a bias voltage 82 at the high pass filter 74 to form a drive signal. The drive signal is applied to the input lead 76 of the hermetically sealed laser diode. The frequency performance 160 of the circuit and laser diode package is shown in FIG. 5. As the figure shows the performance of the combination provides a reasonable flat frequency response. The low frequency cutoff 162 is approximately 100 KHz and the high frequency cutoff 164 is in the neighborhood of 5-6 GHz.

Figure 6:
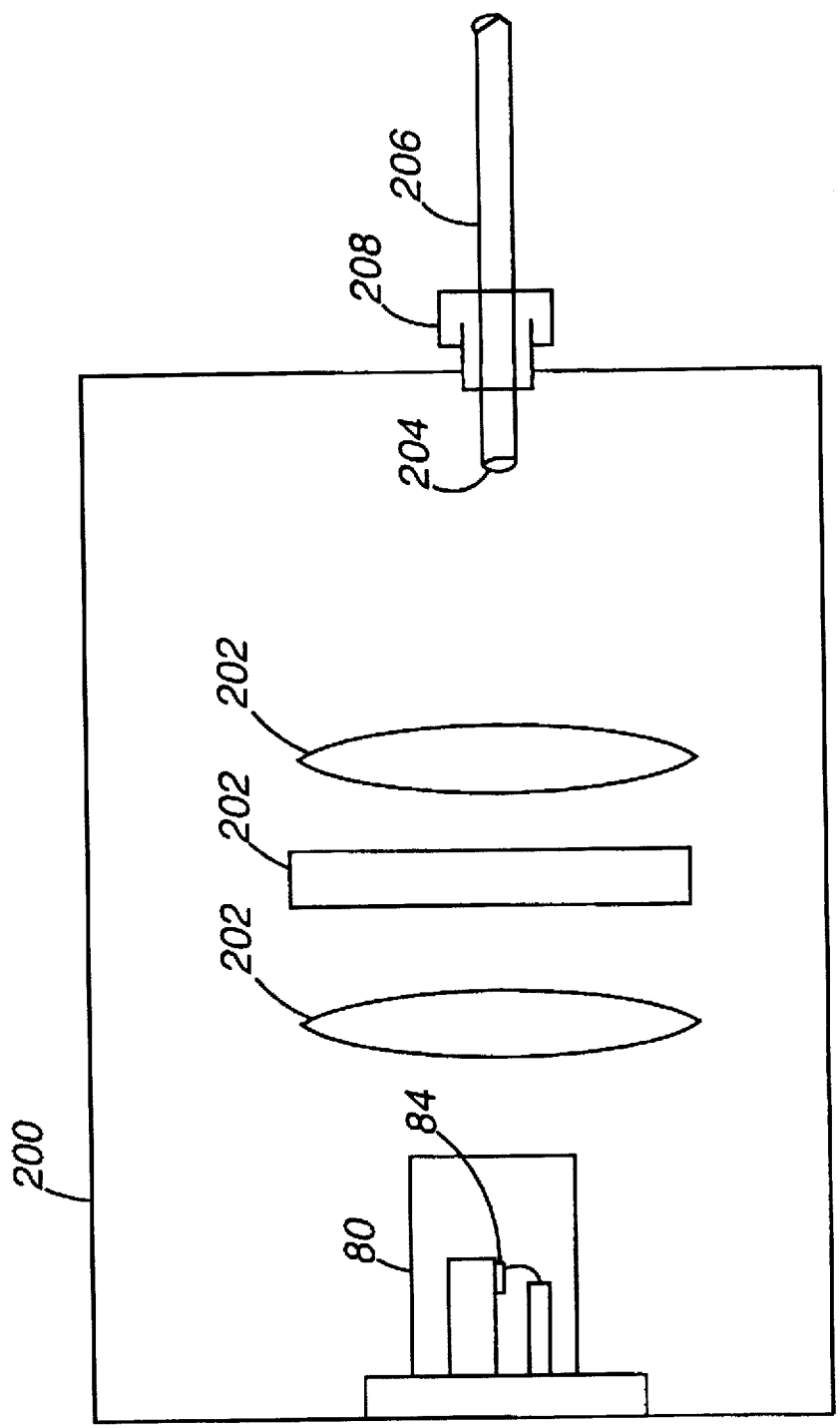
FIG. 6 is a schematic diagram of a second housing.

The laser diode coupling and bias circuit can additionally include a second housing 200 as shown in FIG. 6. The second housing 200 encloses the first housing 80 containing the laser diode 84. The second housing 200 includes a plurality of optics 202 that align the output of the laser diode 84 with an input 204 a fiber optic cable 206. In one embodiment the fiber optic cable 206 is attached to the second housing 200 by a standard fiber optic connector 208. This second housing is much easier to align than the prior art systems because, the optics are larger, the alignment does not have to be done in a clean room and the placement of the laser diode does not vary like the prior art.

Thus there has been described a laser diode coupling and bias circuit and method that allows a laser diode in a TO package to transmit data rates in the gigabit range. In addition to these attributes the circuit and method should be inexpensive and easy to manufacture in small or large quantities. While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A laser diode coupling and bias circuit, comprising
   a laser diode in a hermetically sealed housing having a pair of inputs;
   a printed circuit board having a plurality of connection points and a ground plane, a first of the pair of inputs coupled to a first of the plurality of connection points that is electrically connected to the ground plane, a second of the pair of inputs connected to a second of the plurality of connection points;
   an input transmission line having a blocking capacitor attached to the printed circuit board at a modulation input connection and at the second of the plurality of connection points;
   a two pole equalization filter coupled between the input transmission line and the ground plane; and
   a bias voltage input coupled to the two pole equalization filter.

2. The laser diode coupling and bias circuit of claim 1, wherein the input transmission line includes a plurality of micro-strip line transmission lines connected to the printed circuit board.

3. The laser diode coupling and bias circuit of claim 2, wherein the plurality of micro-strip line transmission lines have an input impedance of fifty ohms.

4. The laser diode coupling and bias circuit of claim 2, wherein the blocking capacitor is connected in series between two of the plurality of micro-strip line transmission lines.

5. The laser diode coupling and bias circuit of claim 2, further including an L pad resistive attenuator coupled between a pair of the plurality of micro-strip line transmission lines.

6. The laser diode coupling and bias circuit of claim 1, wherein the two pole equalization filter comprises a resistor and a capacitor connected in parallel, the resistor and the capacitor having an input coupled to the input transmission line and an output coupled to the second of the plurality of connection points.

7. The laser diode coupling and bias circuit of claim 6, wherein the two pole equalization circuit further includes an inductor having a first end coupled the output of the resistor and the capacitor, a second end of the inductor connected to a first end of a second resistor, a second end of the second resistor connected to a first end of a second capacitor and a second end of the second capacitor connected to ground.

8. The laser diode coupling and bias circuit of claim 7, wherein the bias voltage input is connected to the second end of the second resistor.

9. The laser diode coupling and bias circuit of claim 1, further including a second housing, the second housing enclosing the hermetically sealed housing and a plurality of optical components.

10. A laser diode coupling and bias circuit comprising:
    a transmission line;
    a blocking capacitor in series with the transmission line; and a high pass equalization filter having an inductor, coupled between the transmission line and a ground and operative to connect to a laser diode.

11. The laser diode coupling and bias circuit of claim 10, further including a printed circuit board, the transmission line, and the blocking capacitor being attached to the printed circuit board.

12. The laser diode coupling and bias circuit of claim 10, further including a bias voltage connection point coupled to the high pass equalization filter.

13. The laser diode coupling and bias circuit of claim 10, wherein the high pass equalization filter has a low circuit Q.

14. The laser diode coupling and bias circuit of claim 13, wherein the high pass equalization filter is a two pole filter.

15. The laser diode coupling and bias circuit of claim 10, wherein the transmission line comprises a plurality of surface mount micro-strip line transmission lines.

16. The laser diode coupling and bias circuit of claim 10, further including a resistive attenuator coupled to the transmission line.

17. A method of obtaining broadband performance for a hermetically sealed laser diode, comprising the steps of:
   (a) receiving a broadband modulation input signal;
   (b) transmitting the broadband modulation input signal through an impedance matched transmission line;
   (c) blocking an offset voltage of the broadband modulation input signal to form an AC modulation signal;
   (d) attenuating a low frequency range of the AC modulation signal to form an attenuated signal; and
   (e) combining the attenuated signal with a bias voltage to form a drive signal.

18. The method of claim 17, further including the step of:
   (f) applying the drive signal to an input lead of the hermetically sealed laser diode.

19. The method of claim 17, wherein step (b) further includes the step of resistively attenuating the broadband modulation input signal.

* * * * *